US011457544B2

(12) United States Patent
Joshi et al.

(10) Patent No.: US 11,457,544 B2
(45) Date of Patent: Sep. 27, 2022

(54) POWER ELECTRONICS SYSTEMS COMPRISING A TWO PHASE COLD PLATE HAVING AN OUTER ENCLOSURE AND AN INNER ENCLOSURE

(71) Applicant: Toyota Motor Engineering & Manufacturing North America, Inc., Plano, TX (US)

(72) Inventors: Shailesh N. Joshi, Ann Arbor, MI (US); Danny Lohan, Ann Arbor, MI (US); Hitoshi Fujioka, Ann Arbor, MI (US); Feng Zhou, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 17/165,490

(22) Filed: Feb. 2, 2021

(65) Prior Publication Data
US 2022/0167528 A1 May 26, 2022

Related U.S. Application Data

(60) Provisional application No. 63/117,486, filed on Nov. 24, 2020.

(51) Int. Cl.
*H05K 7/20* (2006.01)
*F28F 13/18* (2006.01)
(Continued)

(52) U.S. Cl.
CPC ..... *H05K 7/20309* (2013.01); *F28D 15/0266* (2013.01); *F28F 13/187* (2013.01);
(Continued)

(58) Field of Classification Search
CPC .......... H05K 7/20309; H05K 7/20318; H05K 7/20336; H05K 7/20327; H05K 7/20936;
(Continued)

(56) References Cited

U.S. PATENT DOCUMENTS

| 8,934,250 B2 | 1/2015 | Campbell et al. |
| 9,531,247 B2 | 12/2016 | Kuznetsov |

(Continued)

FOREIGN PATENT DOCUMENTS

| EP | 3177125 B1 | 12/2019 |
| WO | 2018226059 A1 | 12/2018 |

OTHER PUBLICATIONS

Mohammad Reza Shaeri, et al., "Thin Hybrid Capillary Two-Phase Cooling System," Journal, International Communications in Heat and Mass Transfer, Mar. 2020, vol. 112, Advanced Cooling Technologies, Inc., Lancaster, PA 17601, URL: https://www.sciencedirect.com/science/article/abs/pii/S0735193320300154.

(Continued)

*Primary Examiner* — Adam B Dravininkas
(74) *Attorney, Agent, or Firm* — Dinsmore & Shohl LLP

(57) ABSTRACT

A two-phase cold plate includes an outer enclosure having a fluid inlet and a fluid outlet each fluidly coupled to a fluid pathway, an inner enclosure having a vapor cavity and a vapor outlet, and one or more wicking structures disposed in the outer enclosure. The one or more wicking structures fluidly couple the fluid pathway of the outer enclosure with the vapor cavity of the inner enclosure and the one or more wicking structures comprise a plurality of nucleation sites configured to induce vaporization of a cooling fluid and facilitate vapor flow into the vapor cavity of the inner enclosure.

20 Claims, 8 Drawing Sheets

(51) Int. Cl.
*H01L 23/427* (2006.01)
*H01L 23/473* (2006.01)
*F28D 15/02* (2006.01)

(52) U.S. Cl.
CPC .......... *H01L 23/427* (2013.01); *H01L 23/473* (2013.01); *H05K 7/20327* (2013.01); *H05K 7/20936* (2013.01)

(58) Field of Classification Search
CPC .... H01L 23/427; H01L 23/473; F28F 13/187; F28D 15/0266
See application file for complete search history.

(56) References Cited

U.S. PATENT DOCUMENTS

| | | | | |
|---|---|---|---|---|
| 2002/0131237 | A1* | 9/2002 | Snyder | H01L 23/427 174/16.3 |
| 2003/0159809 | A1* | 8/2003 | Valenzuela | F28D 15/0233 29/890.032 |
| 2005/0235672 | A1 | 10/2005 | Hsu et al. | |
| 2005/0247432 | A1* | 11/2005 | Bhatti | F28F 3/04 165/80.3 |
| 2006/0039111 | A1* | 2/2006 | Huang | H01L 23/427 361/698 |
| 2015/0109735 | A1* | 4/2015 | Campbell | H05K 7/2079 361/700 |
| 2016/0066472 | A1* | 3/2016 | Cader | G06F 1/206 361/699 |
| 2016/0128227 | A1* | 5/2016 | Gernert | H05K 7/2039 165/104.21 |
| 2016/0242312 | A1* | 8/2016 | Singh | H05K 1/181 |
| 2018/0295748 | A1* | 10/2018 | Ukegawa | H05K 7/20336 |
| 2019/0014688 | A1* | 1/2019 | Weibel | H01L 23/427 |
| 2019/0078847 | A1* | 3/2019 | Joshi | H01L 23/3733 |
| 2019/0082560 | A1* | 3/2019 | Dede | B33Y 10/00 |

OTHER PUBLICATIONS

Yoonjin Won, et al., "Mechanical and Thermal Properties of Copper Inverse Opals for Two-Phase Convection Enhancement," 2014, Stanford Department of Mechanical Engineering, Stanford University, Stanford, California 94305, URL: https://nanoheat.stanford.edu/sites/default/files/publications/ITHERM_2014_Won.pdf.

* cited by examiner

POWER ELECTRONICS SYSTEMS COMPRISING A TWO PHASE COLD PLATE HAVING AN OUTER ENCLOSURE AND AN INNER ENCLOSURE

TECHNICAL FIELD

The present specification generally relates to power electronics systems, and more particularly, to power electronics systems having a two phase cold plate for cooling heat generating devices.

BACKGROUND

Currently, power electronic devices (e.g., SiC IGBT or other switching devices) are positioned separate from and cooled separate from passive devices, such as the gate drive devices and capacitors which are used to control their operation. To dissipate high heat flux from power devices, single phase cooling is not adequate, and needs to utilize high performance cooling solution such as two-phase cooling. However, separately cooling power devices and passive devices increases package volume and current techniques for cooling both power devices and passive devices using two phase-cooling, such as techniques that use a porous coating for vaporization, suffers a high pressure drop when directing fluid into the porous coating for vaporization.

Accordingly, a need exists for a unified cooling approach manages the high heat flux of the power components while reduced pump power and reduced package size.

SUMMARY

In one embodiment, a two-phase cold plate includes an outer enclosure having a fluid inlet and a fluid outlet each fluidly coupled to a fluid pathway, an inner enclosure having a vapor cavity and a vapor outlet, and one or more wicking structures disposed in the outer enclosure. The one or more wicking structures fluidly couple the fluid pathway of the outer enclosure with the vapor cavity of the inner enclosure and the one or more wicking structures comprise a plurality of nucleation sites configured to induce vaporization of a cooling fluid and facilitate vapor flow into the vapor cavity of the inner enclosure.

In another embodiments, a power electronics system includes a two-phase cold plate having an outer enclosure and an inner enclosure. The outer enclosure includes a fluid outlet and a fluid inlet each fluidly coupled to a fluid pathway, the fluid pathway having a first edge channel opposite a second edge channel. The inner enclosure includes a vapor cavity and a vapor outlet. One or more wicking structures are disposed within the fluid pathway of the outer enclosure fluidly coupling the vapor cavity of the inner enclosure and the fluid pathway of the outer enclosure and the one or more wicking structures include a plurality of nucleation sites configured to induce vaporization of a cooling fluid and facilitate vapor flow into the vapor cavity of the inner enclosure. In addition, the power electronics system also includes one or more heat generating devices thermally coupled to the two-phase cold plate.

In yet another embodiments, a method of removing heat from one or more heat generating devices includes directing a cooling fluid into an outer enclosure of a two-phase cold plate though a fluid inlet of the outer enclosure, where the two-phase cold plate further includes an inner enclosure. The cooling fluid flows along a fluid pathway of the outer enclosure thereby removing heat from one or more heat generating devices thermally coupled to the fluid pathway of the outer enclosure and at least a portion of the cooling fluid enters one or more wicking structures that fluidly couple the fluid pathway of the inner enclosure with a vapor cavity of the outer enclosure thereby vaporizing at least a portion of the cooling fluid at a plurality of nucleation sites such that vapor flows into the vapor cavity of the inner enclosure and removes heat from one or more heat generating devices thermally coupled to the vapor cavity of the inner enclosure. The method also includes removing heated liquid cooling fluid from the fluid pathway of the outer enclosure and heated vapor cooling fluid from the vapor cavity of the inner enclosure.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
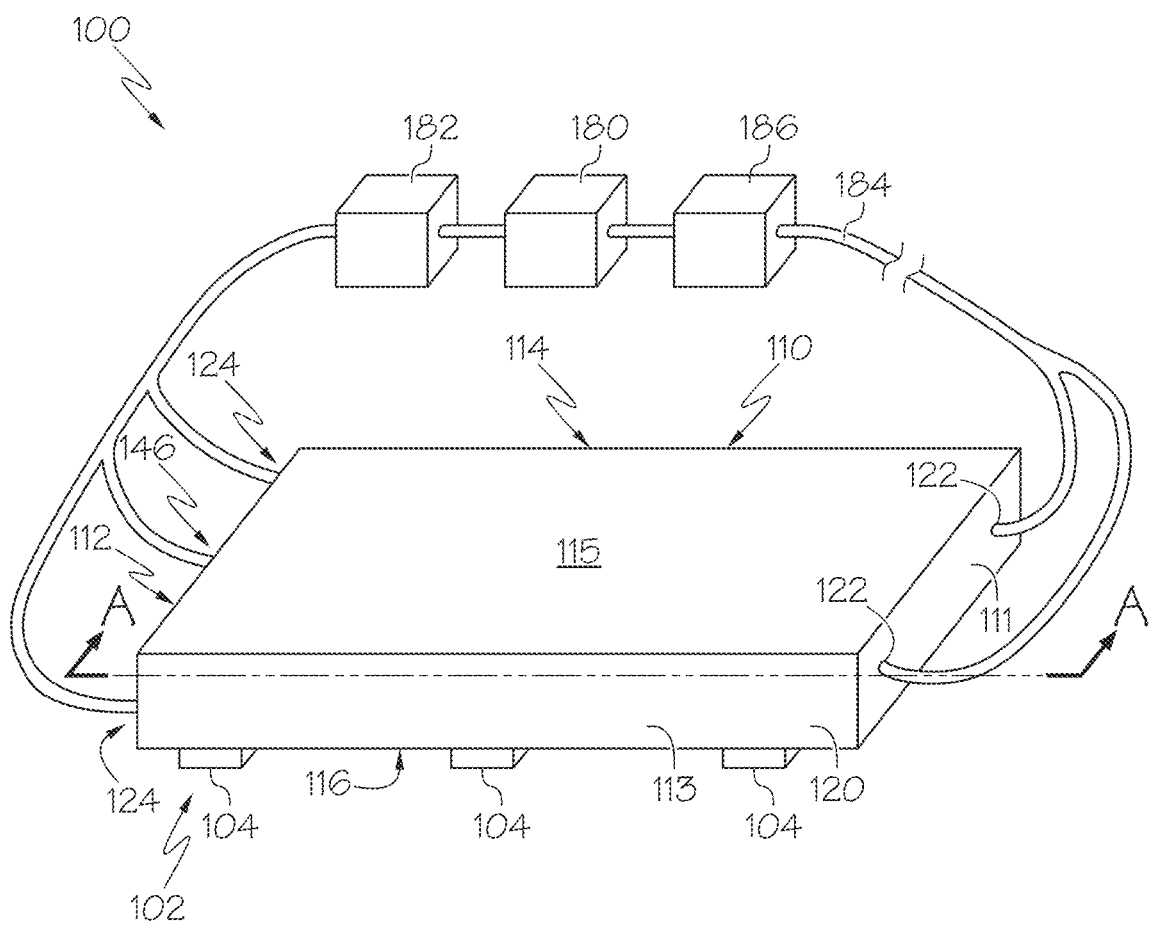
FIG. 1 schematically depicts an power electronics system having a two-phase cold plate thermally coupled to one or more heat generating devices, according to one or more embodiments shown and described herein.

Embodiments described herein are directed to a power electronics system that includes one or more heat generating devices, such as power electronic components and passive electronic components, and a two-phase cold plate for cooling the one or more heat generating devices. The two-phase cold plate includes an outer enclosure with a fluid inlet and a fluid outlet each fluidly coupled to a fluid pathway and an inner enclosure with a vapor cavity and a vapor outlet. The two-phase cold plate further includes one or more wicking structures comprising a porous media that fluidly couple the fluid pathway of the outer enclosure with the vapor cavity of the inner enclosure. In particular, the one or more wicking structures comprise a plurality of nucleation sites configured to induce vaporization of a cooling fluid and facilitate vapor flow into the vapor cavity of the inner enclosure. In operation, liquid cooling fluid flows into the outer enclosure through the fluid inlet and some of the liquid cooling fluid is drawn into the one or more wick structures by capillary action where the liquid cooling fluid evaporates and rises into the vapor cavity of the inner enclosure as a vapor cooling fluid. The vaporization process provides more cooling performance than the liquid flowing in the outer enclosure.

Thus, the two-phase cold plate may be used to cool multiple heat generating devices having different heat load levels. For example, the two-phase cold plate of the embodiments described herein facilitates cooling of low heat generating devices, such as passive electronics components, using the single phase cooling of fluid flowing in the fluid pathway of the outer enclosure and the cooling of high heat generating devices, such as power electronics components, using the two-phase cooling of vaporization at the one or more wicking structures. Moreover, because the liquid cooling fluid is drawn from the fluid pathway into the one or more wicking structures by a capillary force, the pressure drop that occurs within the two-phase cold plate is minimized, minimizing the pumping power needed to generate fluid flow through the two-phase cold plate. Thus, the two-phase cold plate facilitates efficient cooling of low power and high power components in a single, small form factor package with a minimal pressure drop, reducing the achievable package volume of the power electronics system without increasing the required pumping power. Various embodiments of the power electronics system and the two-phase cooling cold plate are described in more detail herein. Whenever possible, the same reference numerals will be used throughout the drawings to refer to the same or like parts.

Referring now to FIG. 1, a power electronics system 100 comprising a two-phase cold plate 110 and one or more heat generating devices 102 is depicted. As depicted in more detail in FIGS. 2A-2E, the two-phase cold plate 110 comprises an outer enclosure 120, an inner enclosure 140, and one or more wicking structures 150 that fluidly couple the outer enclosure 120 and the inner enclosure 140. The outer enclosure 120 comprises a fluid inlet 122 and a fluid outlet 124 each fluidly coupled to the fluid pathway 130. The inner enclosure 140 comprises a vapor cavity 142 with a cavity ceiling 148, one or more vapor openings 144, and a vapor outlet 146. The one or more vapor openings 144 and the vapor outlet 146 are each fluidly coupled to the vapor cavity 142.

The two-phase cold plate 110 also comprises a first end surface 111 opposite a second end surface 112, a first side surface 113 opposite a second side surface 114, and a top surface 115 opposite a bottom surface 116. The outer enclosure 120 surrounds at least a portion of the inner enclosure 140 such that the bottom surface 116 is part of the outer enclosure 120 and is not part of the inner enclosure 140. Indeed, as described in more detail below, vaporized cooling fluid enters the outer enclosure 120 by rising into the vapor cavity 142 of the inner enclosure 140 during operation of the two-phase cold plate 110, as shown by dashed arrow 12, and the inner enclosure 140 is disposed above at least a portion of the outer enclosure 120 during this operation. In some embodiments, the outer enclosure 120 completely encapsulates the inner enclosure 140 and in some embodiments the outer enclosure 120 partially encapsulates the inner enclosure 140 such that they share at least one common wall. It should be understood that the terms "top" and bottom are used to described the relative positioning of the surfaces and components of the two-phase cold plate 110 during a cooling operation. It also should be understood that the top surface 115 may be temporarily positioned below the bottom surface 116 during manufacture, installation, maintenance, or any other non-operational activity in which the two-phase cold plate 110 may be moved.

Figure 2A:
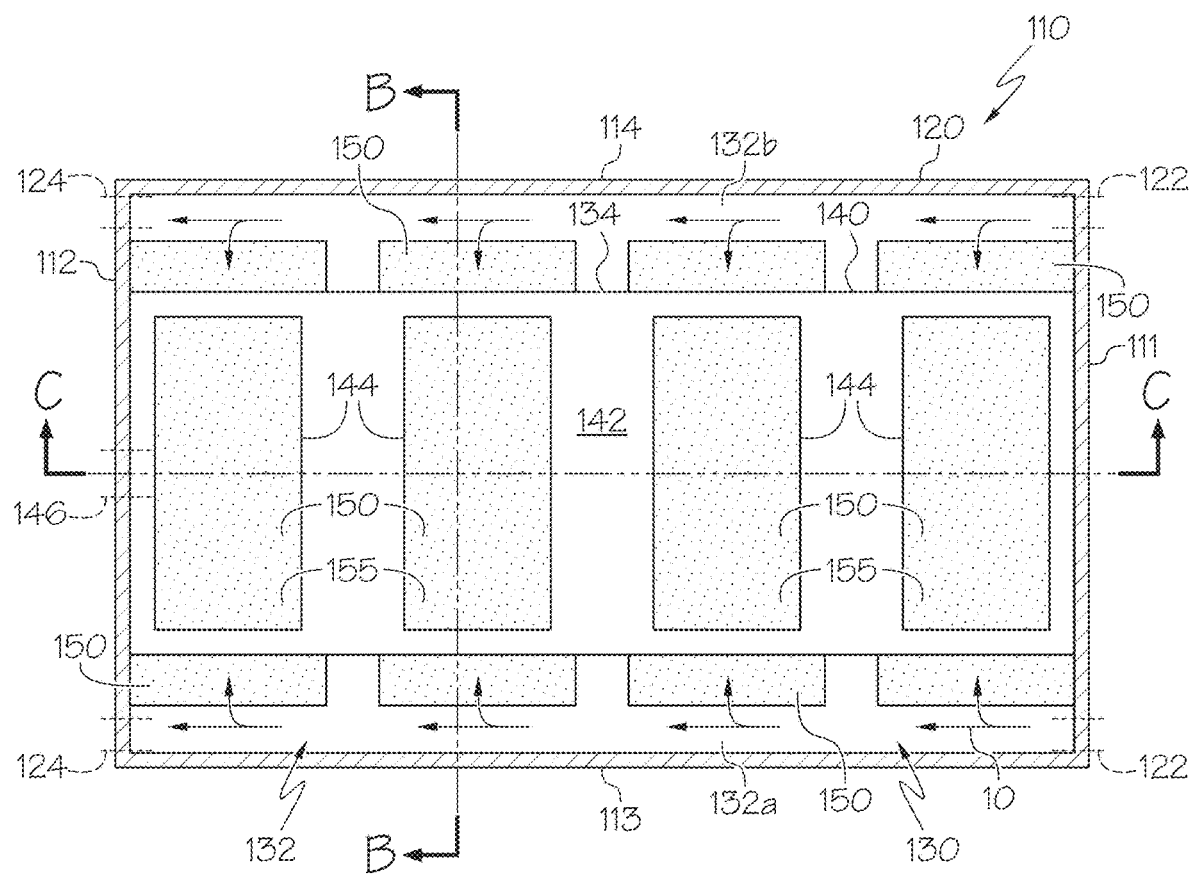
FIG. 2A schematically depicts a cross section of the two-phase cold plate of the power electronics system of FIG. 1 along line A-A, according to one or more embodiments shown and described herein.
Figure 2B:
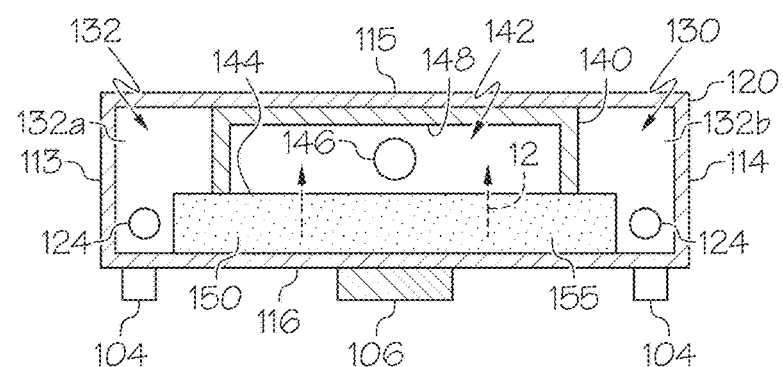
FIG. 2B schematically depicts a cross section of the two-phase cold plate of FIG. 2A along line B-B, according to one or more embodiments shown and described herein.

Referring now to FIGS. 2A-2E, the one or more wicking structures 150 fluidly couple the fluid pathway 130 of the outer enclosure 120 with the vapor cavity 142 of the inner enclosure 140. The one or more vapor openings 144 are aligned with the one or more wicking structures 150 to fluidly couple the fluid pathway 130 of the outer enclosure 120 with the vapor cavity 142 of the inner enclosure 140. The cross section of FIG. 2A shows a portion of the wicking structures 150 that are exposed at each of the vapor openings 144. The one or more wicking structures 150 comprise a porous media, such as sintered metal particles (such as copper particles or nickel particles), a metal inverse opal (MIO) structure 151 (FIGS. 3A and 3B), or a combination thereof. The one or more wicking structures 150 comprise a plurality of nucleation sites 155 configured to induce vaporization of a cooling fluid and facilitate vapor flow through the vapor openings 144 and into the vapor cavity 142 of the inner enclosure 140, as shown by dashed arrow 12. In some embodiments, the one or more wicking structures 150 comprise a graded porosity. For example, the porosity may be greater at the outer portion of the wicking structures 150 (i.e., portions near or in contact with the fluid pathway 130) and may be lower at inner portions of the wicking structures 150. Thus, the higher porosity regions induce increased capillary flow of cooling fluid into the one or more wicking structures 150 and the lower porosity regions induce increased vaporization in the interior of the wicking structures 150. Furthermore, it should be understood that embodiments are contemplated that comprise a plurality of wicking structures 150, as depicted in FIG. 2A, and embodiments are contemplated that comprise a single wicking structure 150.

Figure 3A:
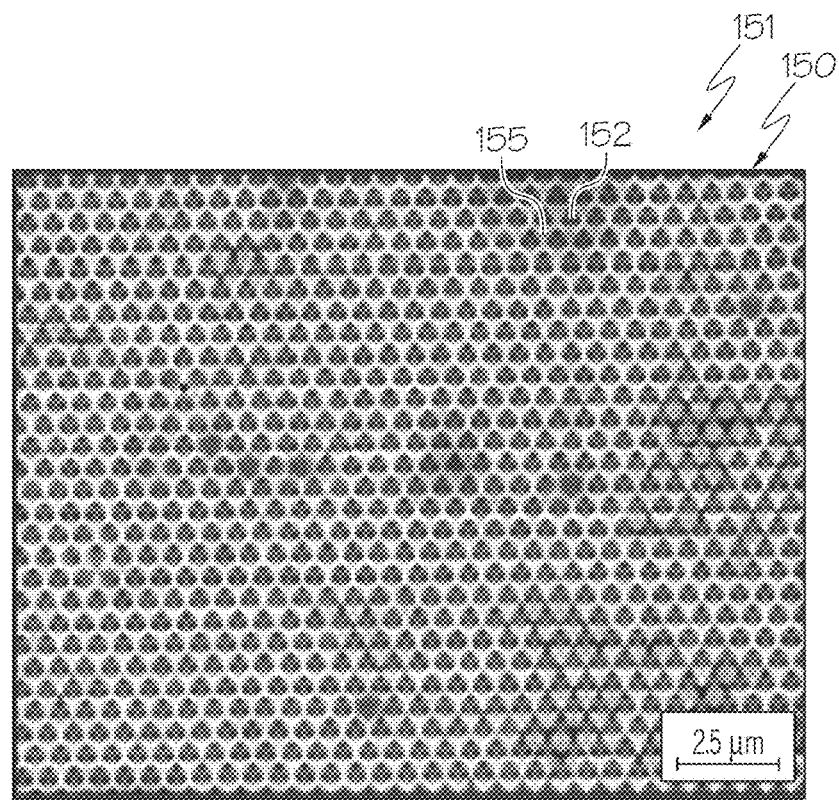
FIG. 3A schematically depicts an example wicking structure of a two-phase cooling plate comprising a metal inverse opal structure formed by vertical deposition, according to one or more embodiments shown and described herein.
Figure 3B:
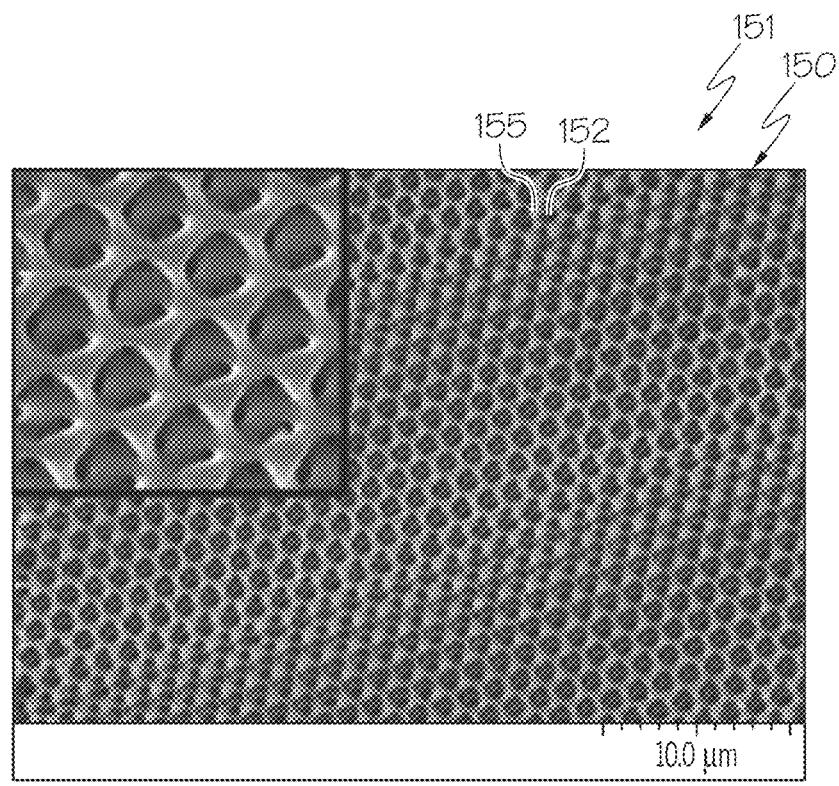
FIG. 3B schematically depicts an example wicking structure of a two-phase cooling plate comprising a metal inverse opal structure formed by holography, according to one or more embodiments shown and described herein.

Referring now to FIGS. 3A and 3B, embodiments of the wicking structure 150 comprising a MIO structure 151 are schematically depicted. In particular, FIG. 3A schematically depicts an MIO structure 151 formed by vertical deposition and FIG. 3B schematically depicts an MIO structure 151 formed by holography. The MIO structure 151 is porous and provides high capillary pressure for efficient cooling. The MIO structure 151 provide increased surface area to engage with a cooling fluid to facilitate heat transfer from one or more heat generating devices 102 to the cooling fluid to cool the one or more heat generating devices 102. For example, the MIO structure 151 includes a plurality of networked pores 152 and/or cavities, which operate as nucleation sites 155. The networked pores 152 may extend throughout the MIO structure 151 such that cooling fluid can flow through the networked pores 152 and allow heat to be exchanged between the MIO structure 151 and the cooling fluid. Without intending to be limited by theory, the geometry of the plurality of networked pores 152 may assist in nucleation of the cooling fluid, further assisting in transferring thermal energy from the MIO structure 151 and removing heat from the one or more heat generating devices 102.

For example and without being bound by theory, thermal energy is required for the cooling fluid to change phase (e.g., from a liquid phase to a solid phase, or from a liquid phase or solid phase to a supercritical phase), and accordingly, the cooling fluid may absorb significant amounts of thermal energy when changing phase from liquid to vapor. That is, the MIO structure 151 may provide nucleation sites 155 in the networked pores 152 to allow liquid cooling fluid to boil and change phase from single phase liquid to vapor. By encouraging nucleation of the cooling fluid, the geometry of the plurality of networked pores 152 may assist in transferring thermal energy from the MIO structure 151 to the cooling fluid being passed through the MIO structure 151. As the MIO structure 151 is thermally coupled to one or more heat generating devices 102 (specifically, one or more high heat components 106 such as power electronics devices), by transferring thermal energy from the MIO structure 151 to the cooling fluid, thermal energy from the one or more heat generating devices 102 may be dissipated by way of the MIO structure 151 through capillary movement of the cooling fluid.

While in the embodiment depicted in FIGS. 3A and 3B, the MIO structure 151 defines networked pores 152 that are regularly spaced from one another it should be understood that this is merely an example and the networked pores 152 may be positioned at irregular intervals from one another. For example, the spacing and size of the networked pores 152 may be non-uniform to facilitated a non-uniform porosity in the MIO structure 141, such as a graded porosity as described above. An MIO structure 151 may be formed in a variety of ways. For example, the MIO structure 151 may be formed by depositing metal within a sacrificial template. The sacrificial template may include, for example and not as a limitation, microspheres that are dissolved after metal deposition to leave a skeletal network of metal with a periodic arrangement of networked pores 152, which may or may not be etched to increase porosity and interconnection of the hollow spheres. In some embodiments, the sacrificial template may include a photoresist layer that is partially ablated with one or more lasers (e.g., holographic lithography using two or more intersecting lasers, three or more intersecting lasers, four or more intersecting lasers) to create a pattern of networked pores 152, which may then be electroplated. The photoresist layer may thereafter be dissolved or burned off through application of heat, leaving the skeletal network. The MIO structure 151 may be formed of any suitable metal or metal alloy, polymer, semiconductor, and may be for example, a copper inverse opal (CIO) structure, a nickel inverse opal (NIO) structure, and/or the like.

Referring again to FIGS. 2A-2E, the fluid pathway 130 of the outer enclosure 120 comprises one or more edge channels 132, for example, a first edge channel 132a and a second edge channel 132b. The edge channels 132 are fluidly coupled to the one or more fluid inlets 122 and fluid outlets 124 of the outer enclosure 120. As shown in FIG. 2A, the one or more wicking structures 150 extend between the first edge channel 132a and the second edge channel 132b. Thus, cooling fluid may enter the one or more wicking structures 150 from the first edge channel 132a and/or the second edge channel 132b by capillary action. In some embodiments, the fluid pathway 130 further comprises one or more cross-enclosure channels 134 extending between the first edge channel 132a and the second edge channel 132b. The cross-enclosure channels 134 extend between adjacent wicking structures 150 and provide additional interface area between the fluid pathway 130 and the one or more wicking structures 150, increasing the amount of the cooling fluid drawn into the one or more wicking structures 150. The cross-enclosure channels 134 also provide fluid connection between the first edge channel 132a and the second edge channel 132b separate from the wicking structures 150. While cross-enclosure channels 134 are shown in FIG. 2A, embodiments are contemplated without cross-enclosure channels 134, for example, embodiments with a single wicking structure 150 extending along the length of the edge channels 132 and embodiments in which solid material structure (e.g., material of the outer enclosure 120) fills the space between adjacent wicking structures 150.

In operation, cooling fluid flows through the outer enclosure 120 along the fluid pathway 130, as shown by solid arrow 10, and removes heat from one or more heat generating devices 102 thermally coupled to the two-phase cold plate 110 by single phase cooling. In some embodiments, the cooling fluid comprises water, such as deionized water, and in other embodiments, the cooling fluid comprises a dielectric fluid such as R-245fa and HFE-7100. When flowing along the fluid pathway 130, at least a portion of the cooling fluid enters the one or more wicking structures 150 by capillary action where cooling fluid may vaporize at a nucleation site 155. This vaporization removes heat from one or more heat generating devices 102 thermally coupled to the two-phase cold plate 110 by two-phase cooling. Cooling fluid that does not enter the one or more wicking structures 150 or is not vaporized in the one or more wicking structures 150 exits the fluid pathway 130 through the one or more fluid outlets 124. Vaporized cooling fluid rises into the vapor cavity 142 where it collects then exits through the vapor outlet 146.

Figure 2C:
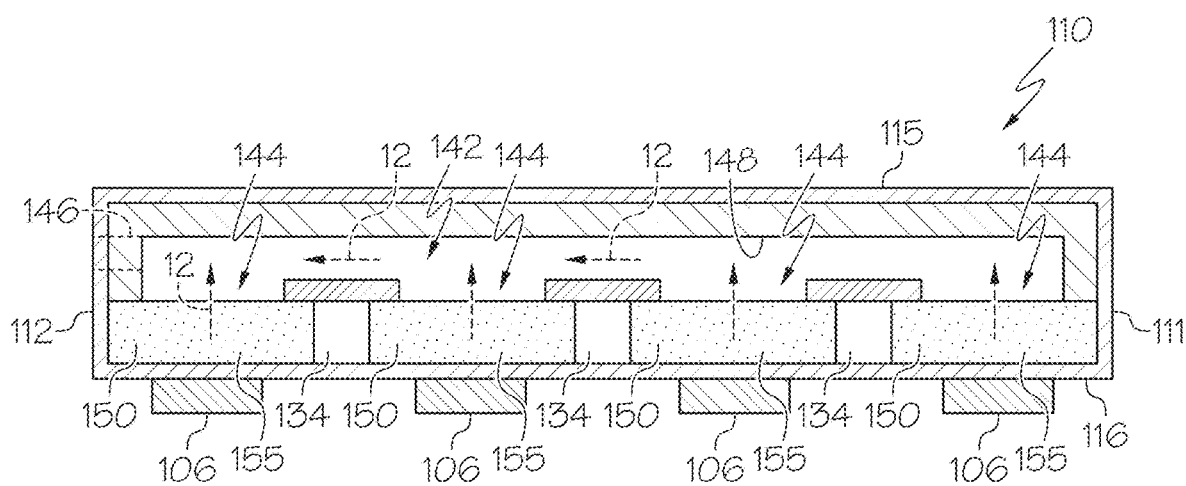
FIG. 2C schematically depicts a cross section of an embodiment of the two-phase cold plate of FIG. 2A along line C-C, according to one or more embodiments shown and described herein.
Figure 2D:
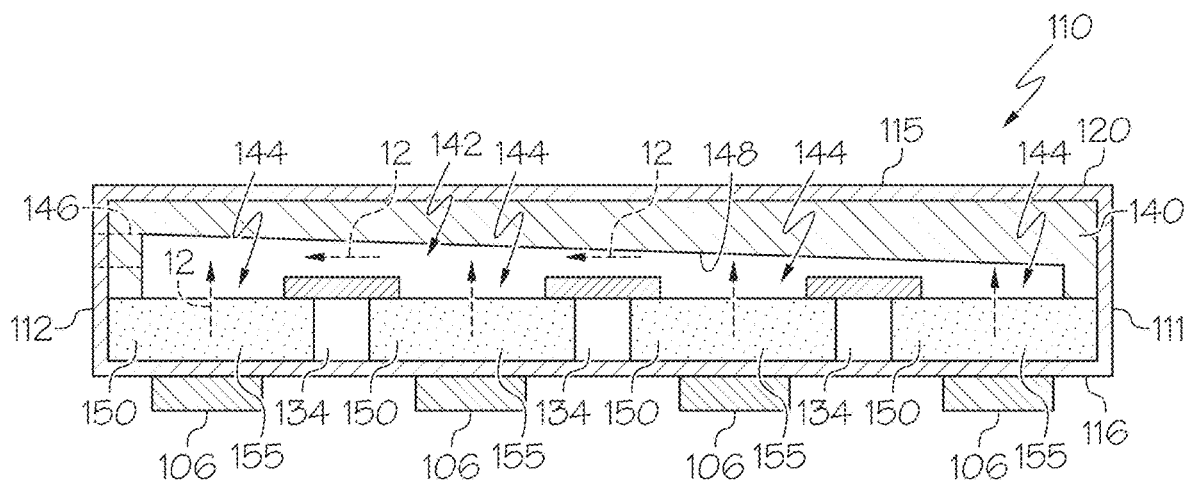
FIG. 2D schematically depicts a cross section of another embodiment of the two-phase cold plate of FIG. 2A along line C-C, according to one or more embodiments shown and described herein.
Figure 2E:
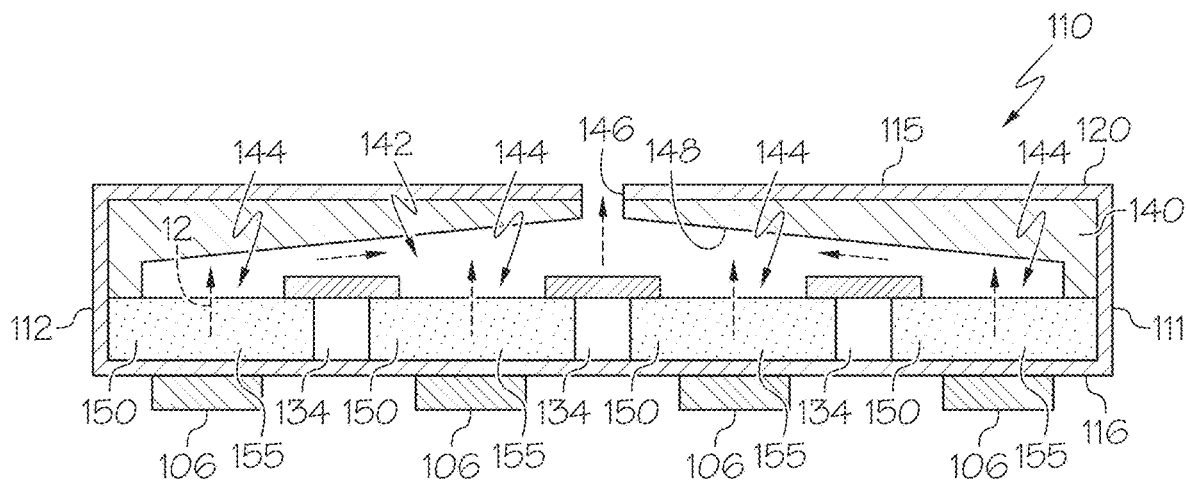
FIG. 2E schematically depicts a cross section of yet another embodiment of the two-phase cold plate of FIG. 2A along line C-C, according to one or more embodiments shown and described herein.

Referring now to FIGS. 2C-2E, three example embodiments of the vapor cavity 142 are depicted. In FIG. 2C, the cavity ceiling 148 of the vapor cavity 142 is planar and the vapor outlet 146 extends though the second end surface 112 of the two-phase cold plate 110. In FIG. 2C, the vapor outlet 146 extends through the second end surface 112 of the two-phase cold plate 110, similar to FIG. 2B, but the cavity ceiling 148 is sloped, rising towards the second end surface 112. This sloped configuration encourages vapor flow toward the vapor outlet 146 and reduces the pumping power needed to remove the vapor. In the embodiments of FIGS. 2C and 2E, the one or more fluid outlets 124 of the outer enclosure 120 and the vapor outlet 146 of the inner enclosure are each disposed at the second end surface 112 and are spaced apart from one another such that the vapor outlet is positioned nearer the top surface 115 than the fluid outlet 124. In FIG. 2E, the vapor outlet 146 extends through the top surface 115 of the two-phase cold plate 110 and the cavity ceiling 148 is sloped, rising toward the vapor outlet 146 from both the first and second end surfaces 111, 112 of the two-phase cold plate 110 and, in some embodiments, from both the first and second side surfaces 113, 114 of the two-phase cold plate 110. The vapor rises to the cavity ceiling 148, so placing the vapor outlet 146 at the top surface 115 allows for easy vapor extraction with reduced pumping power.

Figure 4:
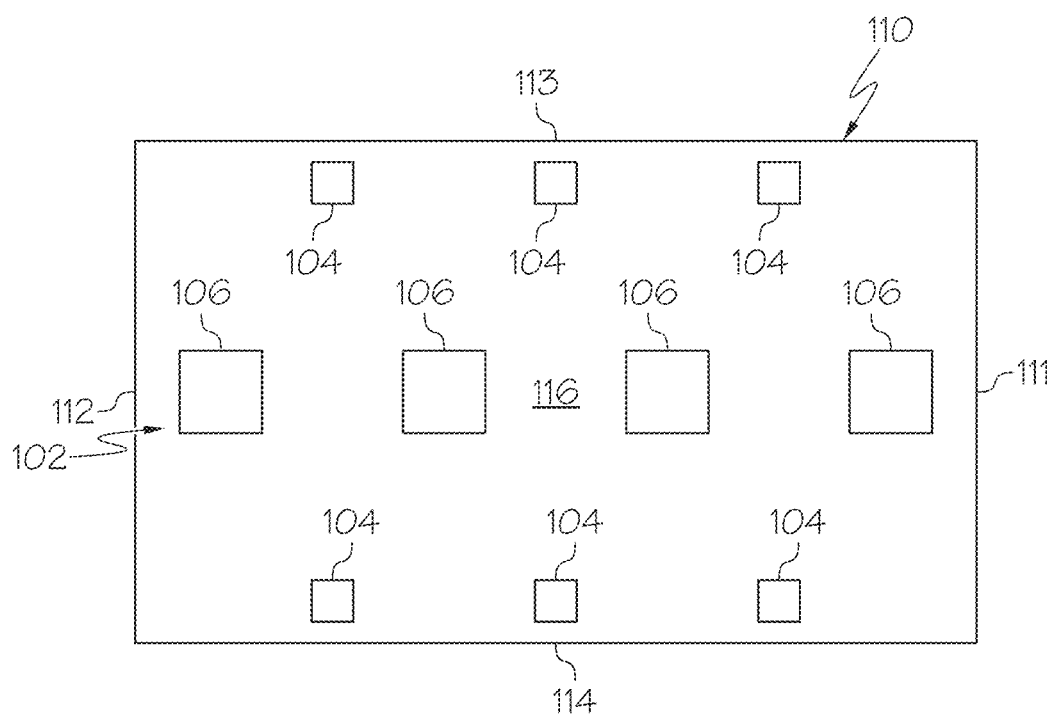
FIG. 4 schematically depicts a bottom surface of the two-phase cold plate of the power electronics system of FIG. 1, according to one or more embodiments shown and described herein.

Referring again to FIGS. 1-3B, and also to FIG. 4, which is a schematic view of the bottom surface 116 of the two-phase cold plate 110, the one or more heat generating devices 102 may comprise one or more low heat components 104 and one or more high heat components 106. Each of the one or more low heat components 104 are coupled to the two-phase cold plate 110 in alignment with the first edge channel 132a or the second edge channel 132b of the fluid pathway 130 such that the low heat components 104 may be cooled by the relatively lower efficiency cooling (when compared to vaporization) provided by liquid cooling fluid flowing through the fluid pathway 130. Each of the one or more high heat components 106 are thermally coupled to the two-phase cold plate 110 in alignment with the one or more wicking structures 150 and the vapor cavity 142 such that the high heat components 106 may be cooled by the relatively higher efficiency (when compared to liquid flow) provided by the vaporization of the cooling fluid at the nucleation sites in the one or more wicking structures 150. In some embodiments, the high heat components 106 comprise power electronics devices, such as an insulated gate bipolar transistor (IGBT), a reverse conducting IGBT (RC-IGBT), a metal-oxide-semiconductor field-effect transistor (MOSFET), a power MOSFET, or the like, and the low heat components 104 comprise the passive electronics that control the operation of the power electronics, such as gate drive devices, capacitors, and inductors.

Figure 5A:
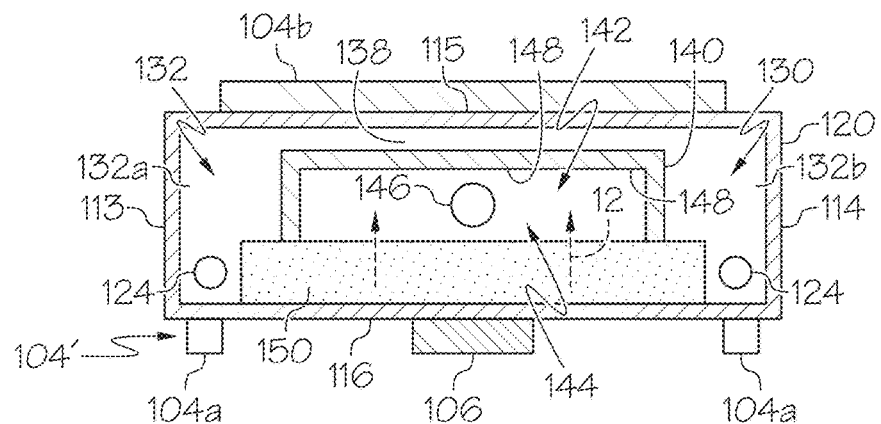
FIG. 5A schematically depicts a cross section of another embodiment of the two-phase cold plate of FIG. 2A along line B-B, the two-phase cold plate having a fluid pathway with an upper segment, according to one or more embodiments shown and described herein.
Figure 5B:
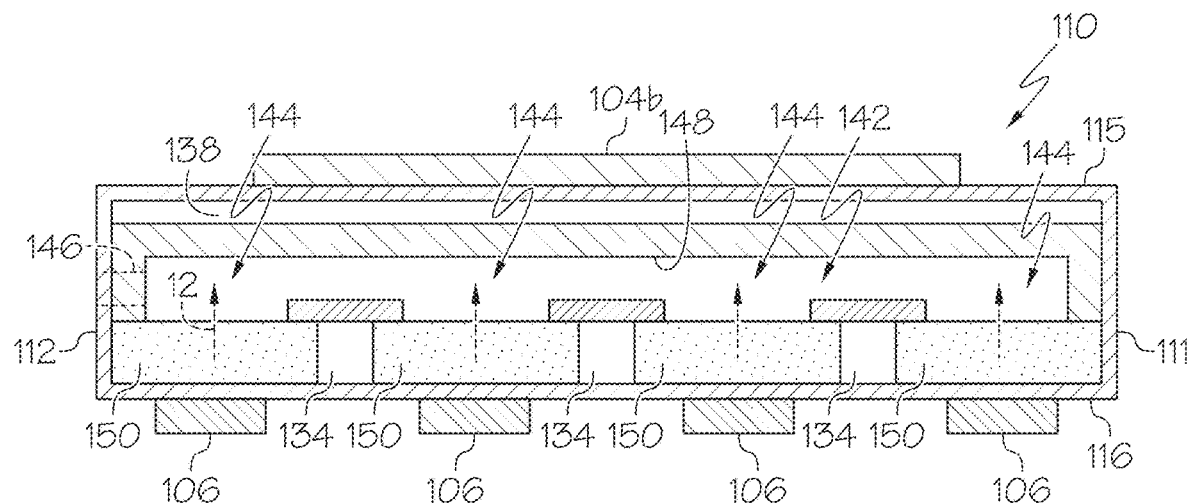
FIG. 5B schematically depicts a cross section of another embodiment of the two-phase cold plate of FIG. 2A along line C-C, the two-phase cold plate having a fluid pathway with an upper segment, according to one or more embodiments shown and described herein.

Referring now to FIGS. 5A and 5B, cross sections of another embodiments of the two-phase cold plate 110 of FIG. 2A along line B-B (FIG. 5A) and line C-C (FIG. 5B are depicted. In particular, the fluid pathway 130 of the outer enclosure 120 of the two phase-cold plate of FIGS. 5A and 5B further comprises an upper segment 138 extending laterally between the first edge channel 132a and the second edge channel 132b and extending vertically between the inner enclosure 140 and the outer enclosure 120. In other words, the upper segment 138 of the fluid pathway 130 extends over the inner enclosure 140 and extends between the inner enclosure and the top surface 115 of the two-phase cold plate 110. The upper segment 138 of the fluid pathway 130 provides increased single phase cooling. In particular, the upper segment 138 facilitates single phase cooling at the top surface 115 of the two-phase cold plate 110. For example, at shown in the FIGS. 5A and 5B, the one or more the one or more low heat components 104 comprise a first subset of low heat components 104a coupled to the bottom surface 116 of the two-phase cold plate 110 in alignment the first edge channel 132a and/or the second edge channel 132b of the fluid pathway 130 and a second subset of low heat components 104b coupled to the top surface 115 of the two-phase cold plate 110 in alignment with the upper segment 138 of the fluid pathway 130. While providing single phase cooling, the upper segment 138 also provides cooling support to the two-phase cooling of the wicking structures 150 and the vapor cavity 142. In particular, heat of the vaporized cooling fluid disposed in the vapor cavity 142 may be removed by the liquid cooling fluid flowing above the vapor cavity 142 in the upper segment 138, increasing the two-phase cooling capacity of the wicking structures 150 of vapor cavity 142.

Figure 6A:
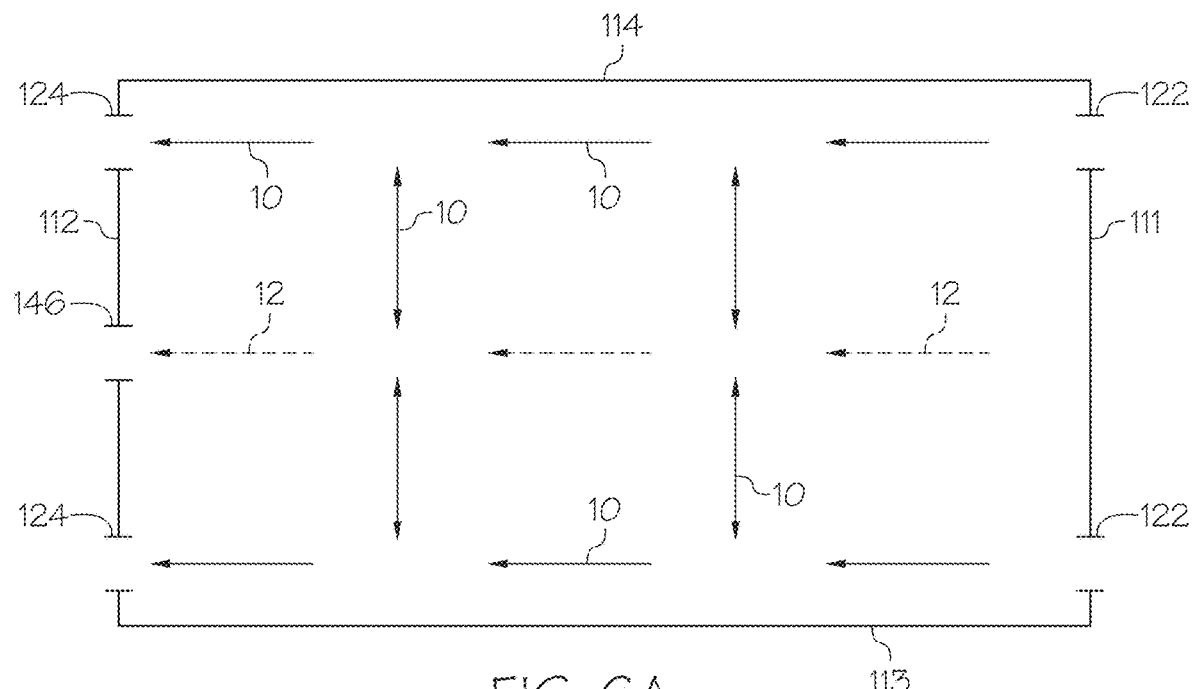
FIG. 6A schematically depicts fluid flow patterns in an example embodiment of a two phase cold plate, according to one or more embodiments shown and described herein.
Figure 6B:
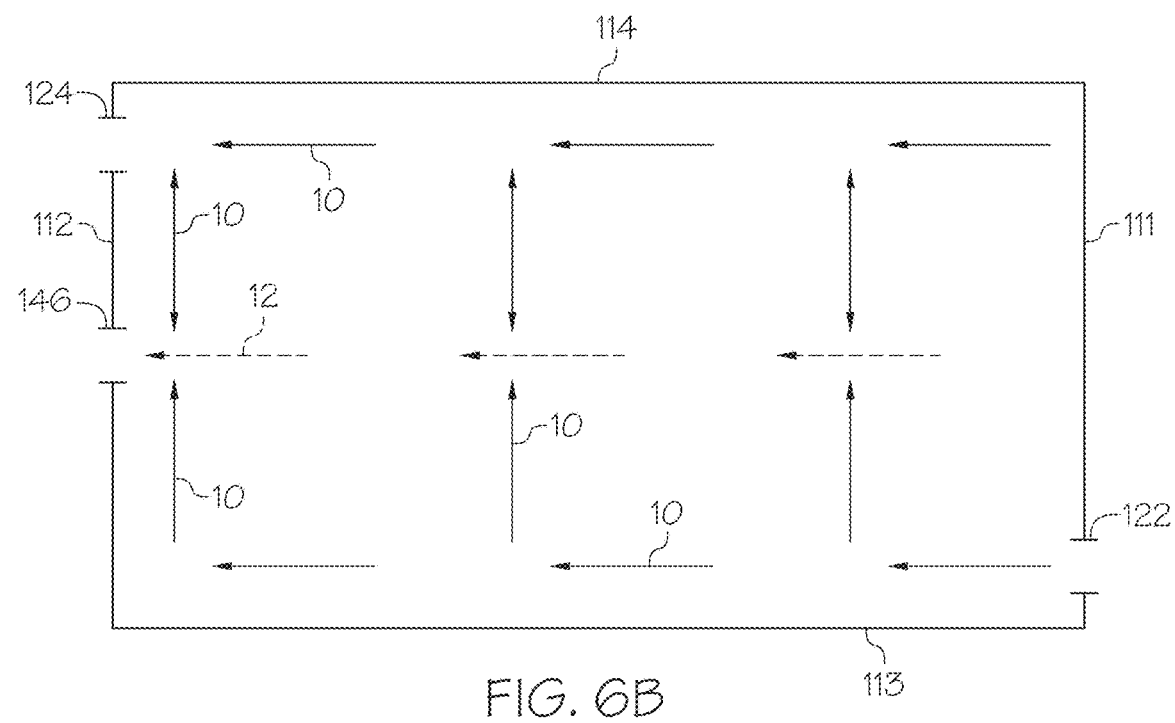
FIG. 6B schematically depicts fluid flow patterns in another example embodiment of a two phase cold plate, according to one or more embodiments shown and described herein.

Referring now to FIGS. 6A-6D, a variety of different fluid flow patterns through the two-phase cold plate 110 are contemplated. The fluid flow patterns are schematically shown by solid arrows 10, which indicate liquid flow, and dashed arrows 12, which indicate vapor flow. In FIG. 6A, the two-phase cold plate 110 comprises two fluid inlets 122 disposed at the first end surface 111, two fluid outlets 124 disposed at the second end surface 112 and a vapor outlet 146 disposed at the second end surface 112. This is the flow pattern of the two-phase cold plate 110 shown in FIG. 2A. In FIG. 6B, the two-phase cold plate 110 comprises a single fluid inlet 122 disposed at the first end surface 111, a single fluid outlet 124 disposed at the second end surface 112, and a vapor outlet 146 disposed at the second end surface 112. The single fluid inlet 122 is nearer the first side surface 113 than the single fluid outlet 124 and the one or more wicking structures 150 are disposed therebetween. In this embodiment, liquid cooling fluid may reach the fluid outlet 124 by passing through the cross-enclosure channels 134, the upper segment 138, or the one or more wicking structures 150 (without vaporizing).

Figure 6C:
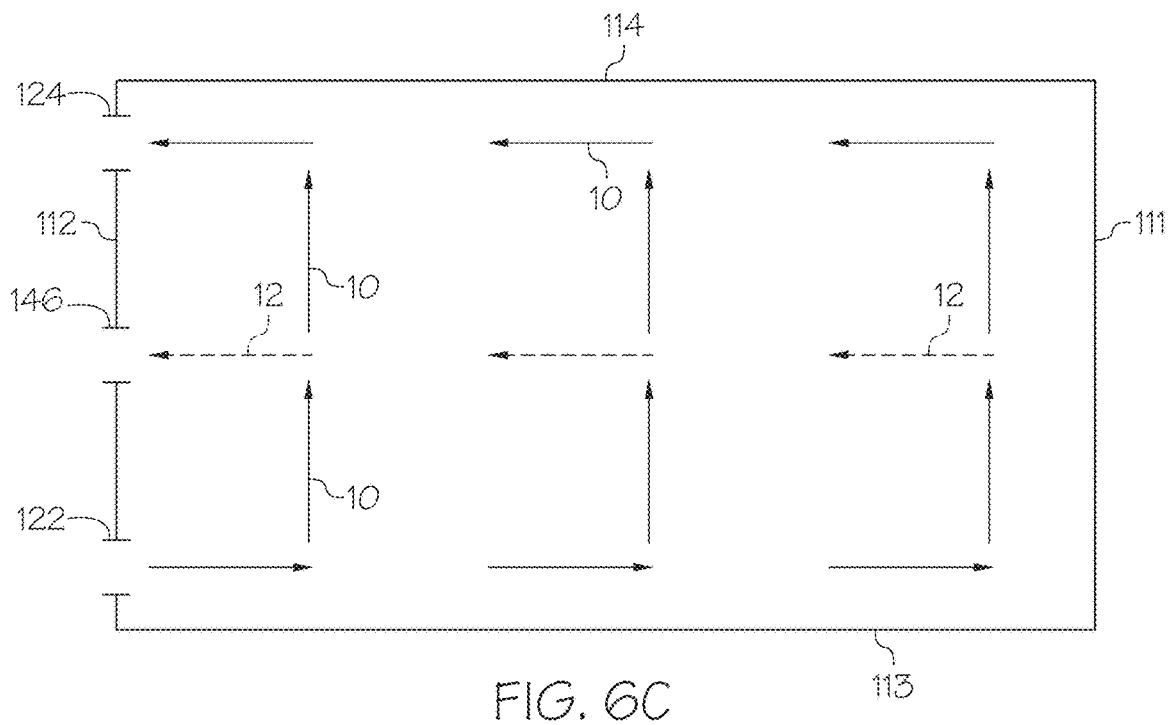
FIG. 6C schematically depicts fluid flow patterns in another example embodiment of a two phase cold plate, according to one or more embodiments shown and described herein.
Figure 6D:
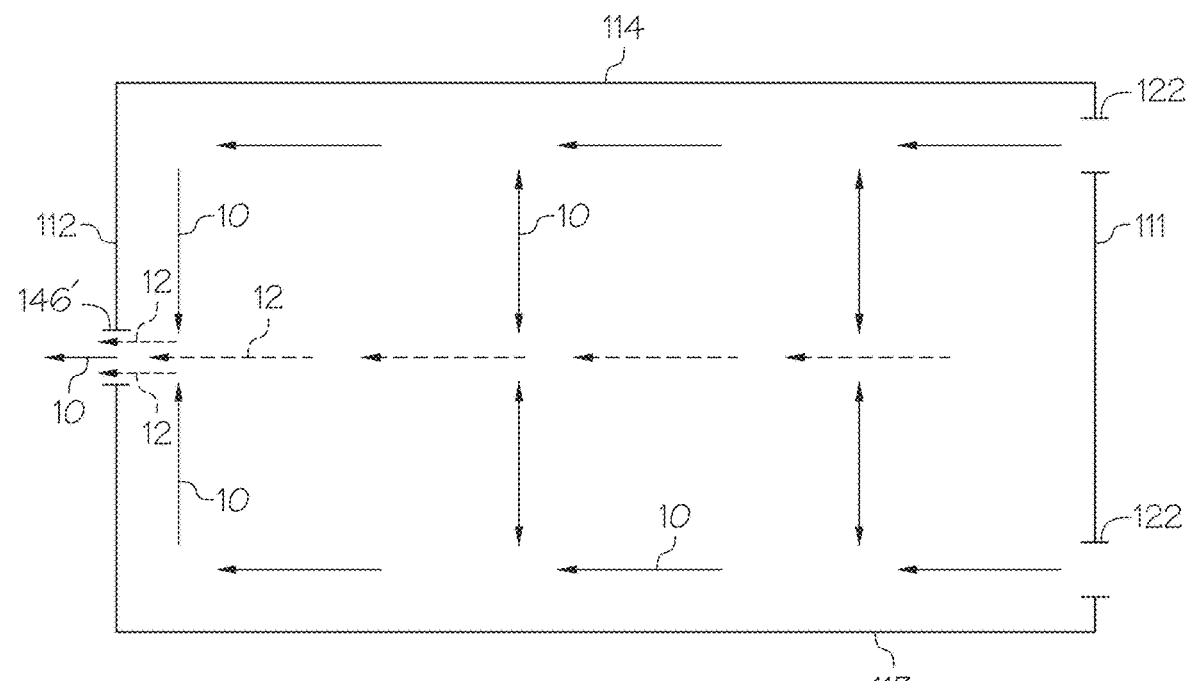
FIG. 6D schematically depicts fluid flow patterns in another example embodiment of a two phase cold plate, according to one or more embodiments shown and described herein.

In FIG. 6C, the two-phase cold plate 110 comprises a single fluid inlet 122 disposed at the second end surface 112, a single fluid outlet 124 disposed at the second end surface 112, and a vapor outlet 146 disposed at the second end surface 112. The single fluid inlet 122 is nearer the first side surface 113 than the single fluid outlet 124 and the one or more wicking structures 150 are disposed therebetween. In this embodiment, liquid cooling fluid may reach the fluid outlet 124 by passing through the cross-enclosure channels 134, the upper segment 138, or the one or more wicking structures 150 (without vaporizing). As shown in FIG. 6C, the flow direction of the liquid fluid reverses after passing through the cross-enclosure channels 134, the upper segment 138, or the one or more wicking structures 150 (without vaporizing). In FIG. 6D, the two-phase cold plate 110 comprises two fluid inlets 122 disposed at the first end surface 111 and a common fluid outlet 146' disposed at the second end surface 112. In this embodiment, the fluid pathway 130 of the outer enclosure 120 and the vapor cavity 142 of the inner enclosure 140 are both fluidly coupled to the common fluid outlet 146', which provides a common outlet for both liquid and vaporized cooling fluid.

Referring again to FIG. 1, the power electronics system 100 may further comprise a cooling fluid reservoir 180, a fluid pump 182, and a secondary heat exchanger 186, each fluidly coupled to the fluid inlet 122 and the fluid outlet 124 of the outer enclosure 120 and the vapor outlet 146 of the inner enclosure 140 in embodiments in which the vapor outlet 146 is separate from the fluid outlet 124. For example, a coolant pipe system 184 may extend between and fluidly couple the fluid inlet 122, the fluid outlet 124, and the vapor outlet 146 with each of the cooling fluid reservoir 180, the fluid pump 182, and the secondary heat exchanger 186, and also fluidly couple the cooling fluid reservoir 180 with both the fluid pump 182 and the secondary heat exchanger 186. The cooling fluid reservoir 180 may house cooling fluid, and the fluid pump 182 may pump the coolant fluid through the two-phase cold plate 110, for example, pump the coolant fluid from the cooling fluid reservoir 180 through the fluid inlet 122 and into the fluid pathway 130 and from the fluid outlet 124 and the vapor outlet 146 to the secondary heat exchanger 186 and the cooling fluid reservoir 180. Further, the secondary heat exchanger 186 may remove heat collected by the cooling fluid before the cooling fluid enters the cooling fluid reservoir 180.

In operation, cooling fluid may be directed into the fluid inlet 122, for example, cooling fluid pumped from the cooling fluid reservoir 180 into the fluid inlet 122 using the fluid pump 182. The cooling fluid may flow from the fluid inlet 122 into the fluid pathway 130. The cooling fluid flows along the fluid pathway 130, as shown by solid arrows 10, thereby removing heat by single phase cooling from one or more heat generating devices 102 thermally coupled to the fluid pathway 130 of the outer enclosure 120, such as one or more low heat components 104 coupled to the two-phase cold plate 110 in alignment with the first edge channel 132a and/or the second edge channel 132b of the fluid pathway 130. At least a portion of the cooling fluid enters the one or more wicking structures 150 by a capillary force and vaporizes the plurality of nucleation sites 155 such that vapor flows into the vapor cavity 142 of the inner enclosure 140, as shown by dashed arrow 12, thereby removing heat by two-phase cooling from one or more heat generating devices 102 thermally coupled to the vapor cavity 142 of the inner enclosure 140, such as one or more high heat components 106 coupled to the two-phase cold plate 110 in alignment with the one or more wicking structures 150 and the vapor cavity 142. Next, heated liquid cooling fluid may be removed from the fluid pathway 130 of the outer enclosure 120 and heated vapor cooling fluid may be removed from the vapor cavity 142 of the inner enclosure 140. In some embodiments, heated liquid cooling fluid may be removed through one or more fluid outlets 124, heated vapor cooling fluid may be removed through the vapor outlet 146. In other embodiments, the heated liquid cooling fluid and the heated vapor cooling fluid by be removed together though the common fluid outlet 146' (FIG. 6D).

It should now be understood that the embodiments described herein may be directed to a power electronics system that includes a two-phase cold plate for cooling the one or more heat generating devices, such as power electronic components and passive electronic components, which operate at different heat loads. In particular, the two-phase cold plate includes an outer enclosure with a fluid pathway for providing single phase cooling and one or more wicking structures that fluidly couple the fluid pathway with a vapor cavity of an inner enclosure. In particular, the one or more wicking structures comprise a plurality of nucleation sites configured to induce vaporization of a cooling fluid and facilitate vapor flow into the vapor cavity of the inner enclosure to provide two-phase cooling. Thus, the two-phase cold plate facilitates a hybrid cooling approach where the low heat generating devices, such as passive electronic components, may be aligned with the fluid pathway for single phase cooling, and the high heat generating devices, such as power electronics devices, may be aligned with the wicking structures and the vapor cavity for two-phase cooling. This hybrid cooling approach provides targeted, efficient cooling in a small form factor package.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A two-phase cold plate comprising:
an outer enclosure comprising a fluid inlet and a fluid outlet each fluidly coupled to a fluid pathway;
an inner enclosure comprising a vapor cavity and a vapor outlet; and
one or more wicking structures disposed in the outer enclosure, wherein:
the one or more wicking structures fluidly couple the fluid pathway of the outer enclosure with the vapor cavity of the inner enclosure; and
the one or more wicking structures comprise a plurality of nucleation sites configured to induce vaporization of a cooling fluid and facilitate vapor flow into the vapor cavity of the inner enclosure.

2. The two-phase cold plate of claim 1, wherein the fluid pathway comprises a first edge channel and a second edge channel and the one or more wicking structures extend between the first edge channel and the second edge channel.

3. The two-phase cold plate of claim 2, wherein:
the one or more wicking structures comprise a plurality of wicking structures each extending from the first edge channel to the second edge channel; and
the plurality of wicking structures are spaced apart from one another and the fluid pathway further comprises a plurality of cross enclosure channels extending between the first edge channel and the second edge channel.

4. The two-phase cold plate of claim 1, wherein the inner enclosure comprises one or more vapor openings aligned with the one or more wicking structures to fluidly couple the vapor cavity of the inner enclosure to the fluid pathway of the outer enclosure.

5. The two-phase cold plate of claim 1, wherein the vapor cavity comprises a sloped cavity ceiling configured to encourage vapor flow towards the vapor outlet.

6. The two-phase cold plate of claim 1, wherein the fluid outlet of the outer enclosure and the vapor outlet of the inner enclosure are each disposed at an end surface of the two-phase cold plate and are spaced apart from one another such that the vapor outlet is positioned nearer a top surface of the two-phase cold plate than the fluid outlet.

7. The two-phase cold plate of claim 1, wherein the fluid outlet of the outer enclosure is disposed at an end surface of the two-phase cold plate and the vapor outlet of the inner enclosure is disposed at a top surface of the two-phase cold plate.

8. The two-phase cold plate of claim 1, wherein the one or more wicking structures comprise sintered copper particles, a copper inverse opal (CIO) structure, or a combination thereof.

9. The two-phase cold plate of claim 1, wherein the fluid pathway of the outer enclosure comprises an upper segment that extends over the inner enclosure.

10. The two-phase cold plate of claim 1, wherein the fluid inlet of the outer enclosure is disposed at a first end surface of the two-phase cold plate and the fluid outlet of the outer enclosure and is disposed at a second end surface of the two-phase cold plate, opposite the first end surface.

11. The two-phase cold plate of claim 1, wherein the fluid inlet and the fluid outlet of the outer enclosure are each disposed at a second end surface of the two-phase cold plate, opposite a first end surface of the two-phase cold plate.

12. A power electronics system comprising:
two-phase cold plate comprising an outer enclosure and an inner enclosure, wherein:
the outer enclosure comprises a fluid outlet and a fluid inlet each fluidly coupled to a fluid pathway, the fluid pathway comprising a first edge channel opposite a second edge channel;
the inner enclosure comprises a vapor cavity and a vapor outlet;
one or more wicking structures are disposed within the fluid pathway of the outer enclosure fluidly coupling the vapor cavity of the inner enclosure and the fluid pathway of the outer enclosure; and
the one or more wicking structures comprise a plurality of nucleation sites configured to induce vaporization of a cooling fluid and facilitate vapor flow into the vapor cavity of the inner enclosure; and
one or more heat generating devices thermally coupled to the two-phase cold plate.

13. The power electronics system of claim 12, wherein the one or more heat generating devices comprise one or more low heat components and one or more high heat components, each of the one or more low heat components are coupled to the two-phase cold plate in alignment with the first edge channel or the second edge channel of the fluid pathway, and each of the one or more high heat components are coupled to the two-phase cold plate in alignment with the vapor cavity of the inner enclosure.

14. The power electronics system of claim 13, wherein the one or more low heat components comprise a gate drive device, a capacitor, an inductor, or a combination thereof and the one or more high heat components comprise a power MOSFET, a transistor MOSFET, an IGBT, an RC-IGBT, or a combination thereof.

15. The power electronics system of claim 13, wherein the one or more wicking structures extend between the first edge channel and the second edge channel.

16. The power electronics system of claim 15, wherein:
the one or more wicking structures comprise a plurality of wicking structures each extending from the first edge channel to the second edge channel; and
the plurality of wicking structures are spaced apart from one another and the fluid pathway further comprises a plurality of cross enclosure pathways extending between the first edge channel and the second edge channel.

17. The power electronics system of claim 13, wherein:
the fluid pathway of the outer enclosure comprises an upper segment that extends over the inner enclosure between the inner enclosure and a top surface of the two-phase cold plate;
the one or more low heat components comprise a first subset of low heat components coupled to a bottom surface of the two-phase cold plate in alignment the first edge channel or the second edge channel of the fluid pathway and a second subset of low heat components coupled to the top surface of the two-phase cold plate in alignment with the upper segment of the fluid pathway; and
the one or more high heat components are coupled to the bottom surface of the two-phase cold plate in alignment with the vapor cavity of the inner enclosure.

18. A method of removing heat from one or more heat generating devices, the method comprising:
directing a cooling fluid into an outer enclosure of a two-phase cold plate though a fluid inlet of the outer enclosure, the two-phase cold plate further comprising an inner enclosure, wherein:
the cooling fluid flows along a fluid pathway of the outer enclosure thereby removing heat from one or more heat generating devices thermally coupled to the fluid pathway of the outer enclosure; and
at least a portion of the cooling fluid enters one or more wicking structures that fluidly couple the fluid pathway of the inner enclosure with a vapor cavity of the outer enclosure thereby vaporizing at least a portion of the cooling fluid at a plurality of nucleation sites such that vapor flows into the vapor cavity of the inner enclosure and removes heat from one or more heat generating devices thermally coupled to the vapor cavity of the inner enclosure; and
removing heated liquid cooling fluid from the fluid pathway of the outer enclosure and heated vapor cooling fluid from the vapor cavity of the inner enclosure.

19. The method of claim 18, wherein the one or more heat generating devices comprise one or more low heat components and one or more high heat components, each of the one or more low heat components are coupled to the two-phase cold plate in alignment with one or more edge channels of the fluid pathway, and each of the one or more high heat components are coupled to the two-phase cold plate in alignment with the vapor cavity of the inner enclosure.

20. The method of claim 19, wherein:
the fluid pathway of the outer enclosure comprises an upper segment that extends over the inner enclosure between the inner enclosure and a top surface of the two-phase cold plate;
the one or more low heat components comprise a first subset of low heat components coupled to a bottom surface of the two-phase cold plate in alignment the one or more edge channels of the fluid pathway and a second subset of low heat components coupled to the top surface of the two-phase cold plate in alignment with the upper segment of the fluid pathway; and
the one or more high heat components are coupled to the bottom surface of the two-phase cold plate in alignment with the vapor cavity of the inner enclosure.

\* \* \* \* \*